United States Patent [19]
Foo

[11] Patent Number: 5,515,207
[45] Date of Patent: May 7, 1996

[54] MULTIPLE MIRROR CATADIOPTRIC OPTICAL SYSTEM

[75] Inventor: Leslie D. Foo, San Jose, Calif.

[73] Assignee: Nikon Precision Inc., Belmont, Calif.

[21] Appl. No.: 147,203

[22] Filed: Nov. 3, 1993

[51] Int. Cl.⁶ .................................................. G02B 17/08
[52] U.S. Cl. .............................................................. 359/731
[58] Field of Search ................................... 359/727, 726, 359/728, 730, 731, 729

[56] References Cited

U.S. PATENT DOCUMENTS

| | | | |
|---|---|---|---|
| 2,585,009 | 2/1952 | Henroteau | 177/319 |
| 2,664,026 | 12/1953 | Kavanagh | 88/57 |
| 3,062,101 | 11/1962 | McCarthy | 88/57 |
| 3,455,623 | 7/1969 | Harris | 350/55 |
| 3,536,380 | 10/1970 | Ferguson | 350/199 |
| 3,748,015 | 7/1973 | Offner | 350/55 |
| 3,821,763 | 6/1974 | Scott | 354/94 |
| 3,827,778 | 8/1974 | Wheeler | 350/55 |
| 4,293,186 | 10/1981 | Offner | 350/27 |
| 4,395,095 | 7/1983 | Horton | 350/504 |
| 4,469,414 | 9/1984 | Shafer | 350/444 |
| 4,685,777 | 8/1987 | Hirose | 350/505 |
| 4,701,035 | 10/1987 | Hirose | 350/505 |
| 4,711,535 | 12/1987 | Shafer | 350/442 |
| 4,747,678 | 5/1988 | Shafer et al. | 350/505 |
| 4,772,107 | 9/1988 | Friedman | 350/463 |
| 4,779,966 | 10/1988 | Friedman | 350/442 |
| 4,796,984 | 1/1989 | Wynne | 350/444 |
| 4,812,028 | 3/1989 | Matsumoto | 350/444 |
| 4,953,960 | 9/1990 | Williamson | 350/442 |

FOREIGN PATENT DOCUMENTS 553569 5/1977 U.S.S.R. .
637772 12/1978 U.S.S.R. .

OTHER PUBLICATIONS

J. Dyson, "Unit Magnification Optical System without Seidel Aberrations", *Journal of the Optical Society of America*, vol 49, No 7, Jul., 1959, pp. 713–716.

Seymour Rosin, "Inverse Cassegrainian System", *Applied Optics*, Aug., 1968, vol. 7, No. 8, pp. 1483–1497.

Rubin Gelles, "Unobscured Aperture Stigmatic Telescopes", *Optical Engineering*, Nov./Dec., 1974, vol. 13, No. 6, pp. 534–538.

Rubin Gelles, "Unobscured–aperture two–mirror system", *Journal of the Optical Society of America*, vol. 10, Oct., 1975, pp. 1141–1143.

*Primary Examiner*—Scott J. Sugarman
*Attorney, Agent, or Firm*—Townsend & Townsend and Crew

[57] ABSTRACT

A reduction projection system (10) characterized by large numerical aperture has an unobscured optical path without the need to resort to truncated lens elements. The system includes first and second reduction stages. The first reduction stage includes a first mirror group (20) and a first lens group (30). The second reduction stage includes a second mirror group (40) and a second lens group (50). Together, the first mirror group and the first lens group form an intermediate reduced image of the object at an intermediate image region (70). The second mirror group and the second lens group form a further reduced image at an image plane (15).

37 Claims, 4 Drawing Sheets

MULTIPLE MIRROR CATADIOPTRIC OPTICAL SYSTEM

BACKGROUND OF THE INVENTION

The present invention relates generally to optical projection systems, and more particularly to off-axis catadioptric (including lenses and mirrors) reduction systems such as might be useful for microlithography.

As the feature sizes on integrated circuit devices have grown ever smaller, the demands on the optical train in the microlithography system have grown ever greater. In order to achieve resolution characteristics that are commensurate with future requirements for optical systems, the numerical aperture required is in excess of the current state-of-the-art optical systems. The prior art, as exemplified by U.S. Pat. Nos. 4,685,777 and 4,701,035, describes reducing optical projection systems where the bulk of the optical power is developed with curved mirrors, and lenses are used to correct aberrations. The systems described in these patents have numerical apertures of 0.25 and 0.18 respectively.

In order to achieve a degree of compactness, the optical path is often folded, either by the curved mirrors or by flat folding mirrors introduced into the optical path. A number of the prior art systems incur the need to use truncated and in some cases decentered optical elements in order to avoid obscuring the path of the beam as it is reflected back. Truncated lens elements are much more difficult to align along the optical axis, and decentered elements introduce significant aberrations and errors. In the manufacturing process the requirement for maintaining contour accuracy of the optical surfaces of truncated elements increases the cost of the components considerably relative to that of non-truncated equivalents. A further problem with truncated optical elements occurs in the application of the system when, due to the use of a high-powered laser, optical elements are subject to increased temperatures which causes non-radially-symmetric gradients in the truncated components. This could reduce the optical performance of systems containing those elements considerably.

SUMMARY OF THE INVENTION

The present invention provides a reduction projection system characterized by large numerical aperture (NA). The system has an unobscured optical path without the need to resort to truncated lens elements and provides accessible locations for aperture stops. The system is adapted to being constructed in modules.

In brief, a system according to the present invention includes first and second reduction stages. The first reduction stage includes a first mirror group and an optional first lens group, and forms an intermediate reduced image of the object at an intermediate image region. The second reduction stage includes a second mirror group and a second lens group, and forms a further reduced image at a final image plane.

The various optical elements are configured and cooperate to allow flat folding mirrors to be introduced into the path without requiring any of the lens elements in the path to be truncated. The use of full diameter elements facilitates alignment, thereby keeping decentration-induced aberrations to a minimum. These elements are also easier to fabricate than truncated and can be mounted in simple barrel assemblies. The lens and mirror elements are preferably spherical, which further facilitates manufacture. In a specific embodiment, a first folding mirror is introduced between the object plane and the first mirror group, and a second between the first reduction stage and the second reduction stage.

The second mirror in the first mirror group requires very little power and therefore, in one embodiment, this mirror is constrained to be a flat mirror. This mirror also doubles as an aperture stop, suppressing stray light and effectively controlling the NA. The first and third mirrors of the second mirror group ideally have nearly the same power and the same location. In the preferred embodiment, these two mirrors are constrained to have the same curvature and the same center of curvature, thus allowing a single mirror to serve the dual role of the first and third mirrors of this triplet. This results in a further lowering of the manufacturing costs.

A further understanding of the nature and advantages of the present invention may be realized by reference to the remaining portions of the specification and the drawings.

DESCRIPTION OF SPECIFIC EMBODIMENTS

Figure 1:
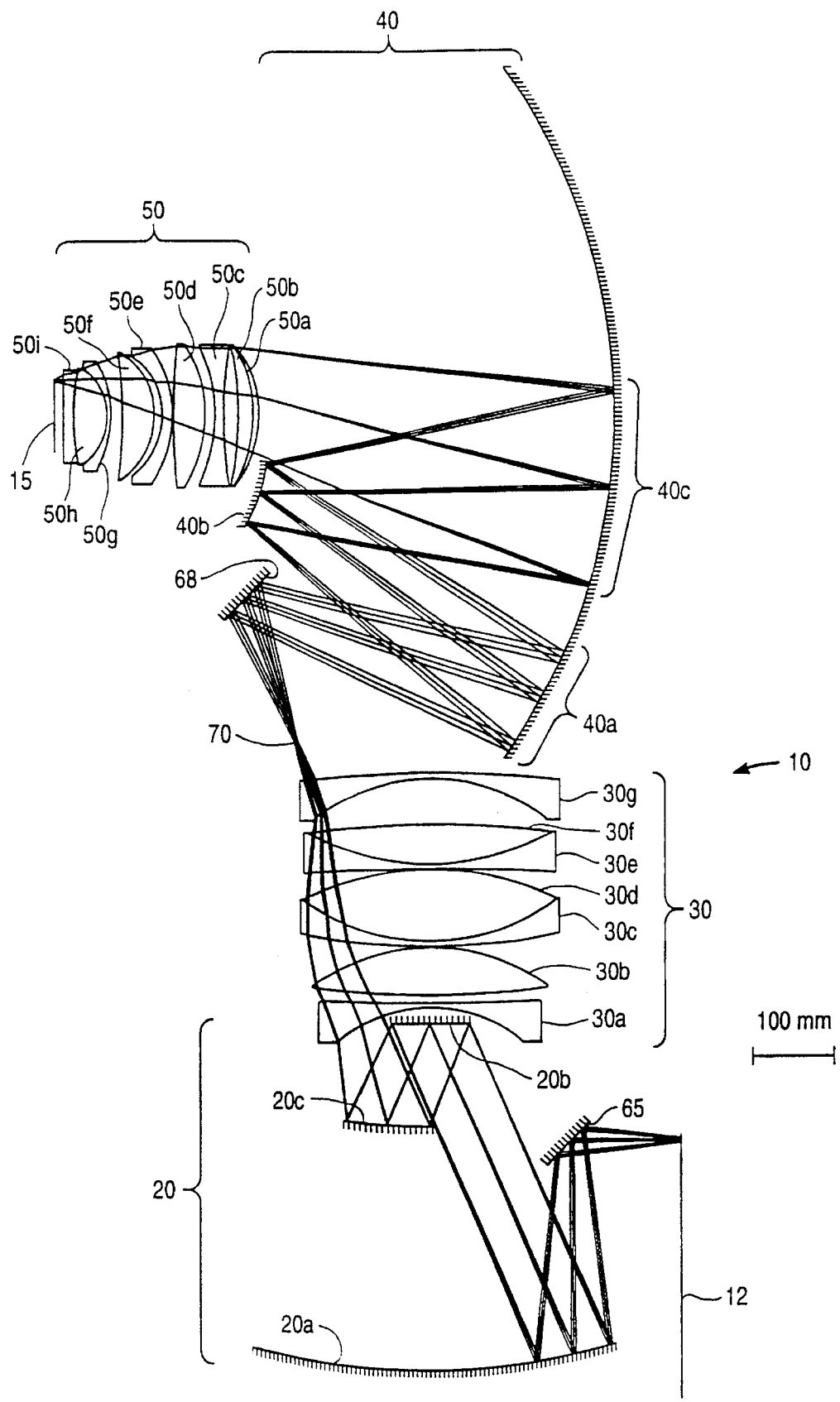
FIG. 1 is an optical schematic of a projection system according to the present invention.

FIG. 1 is an optical schematic of a specific embodiment of a multiple mirror catadioptric reduction system 10 according to the present system. The system is characterized by a common optical axis. The basic function of system 10 is to produce a reduced image of an off-axis ring-shaped field in an object plane 12 at an image plane 15. In normal operation, a reticle would be located in the object plane and a photoresist layer on a wafer to be patterned would be in the image plane. In the specific embodiment, the reduction is by a factor of 4.

The system includes a first mirror group 20 having elements 20a–c, a first lens group 30 having lenses 30a–g, a second mirror group 40 having mirrors 40a–c, and a second lens group 50 having lenses 50a–i. In this embodiment, all the lenses are centered on the optical axis and the curved mirrors are front surface mirrors having their centers of curvature on the optical axis. The system is designed to be telecentric on both the image and the object side, thus making the illumination constant across the field.

The term "mirror" as used herein is intended to include any optical element having one or more fully or partially reflective surfaces. The term "lens" as used herein is intended to include diffraction-based optical elements in addition to the widely-used refraction-based elements.

A first flat folding mirror 65 is interposed in the path between object plane 12 and first mirror group 20. A second fold mirror 68 is interposed between first lens group 30 and second mirror group 40. The folding mirrors are required if a compact system is desired, and one of the significant advantages of the present invention is that it allows the placement of folding mirrors without requiring that any of the lens elements be truncated. The fold mirrors in one embodiment also force the image and object planes to be parallel thus allowing both the mask and the wafer to be scanned in the same direction. Parallel scanning is preferred since this simplifies the mechanical design.

In operation, light emerging from a point in object plane 12 is first reflected by fold mirror 65. The reflected light then encounters the first mirror group and the first lens group which cooperate as a first reduction stage to form an intermediate reduced image in an image region 70. The intermediate image is not necessarily well focused or well corrected. The light emerging from the intermediate image region is reflected by second fold mirror 68 to a second reduction stage, comprising the second mirror group and the second lens group, in order to form a further reduced image in image plane 15.

The optical design of the system is driven primarily by four parameters; image quality, NA, distortion, and telecentricity. Furthermore, specific elements of the design can be constrained to certain locations or performance characteristics. By placing constraints on various optical elements, cost and size benefits can be realized. Two examples, in the first and second mirror groups, will be discussed below.

The image quality is defined as how well an image can be resolved, thus determining what size features can be achieved in the reduced image plane. Distortion affects the positioning of these features, for example causing a straight line in the object plane to appear as a curved line in the object plane. Telecentricity in both the object and image sides is desirable since it not only helps reduce errors associated with system defocusing but also insures uniform field illumination.

The first reduction stage provides a reduction by a factor of about 1.4 (i.e., the intermediate image has linear dimensions on the order of 0.7 those of the object). The bulk of the optical power in this stage is provided by first mirror group 20, which includes mirrors 20a, 20b, and 20c. In the preferred embodiment, mirror 20b is constrained to be a flat mirror. If the system were optimized strictly from a performance standpoint without including any manufacturing or fabrication concerns, mirror 20b would only have a slight curvature. Therefore by constraining the mirror to be flat, very little performance is lost and yet the mirror is significantly easier to fabricate.

Mirror 20b also serves as an aperture stop for the system, limiting the amount of light which is transmitted by the system. By adjusting the dimensions of this aperture stop, the NA, and therefore the depth of focus and the resolution of the system can be changed. Due to the trade-off between NA and system resolution, the aperture stop must be chosen to meet the specific design requirements of the system user. Altering the aperture stop can either be by simple replacement, as in the preferred embodiment, or the stop can be designed to be adjustable thus allowing the system to be varied as user needs change. The aperture stop is placed at the focus of mirror 20a in order to achieve telecentricity at the object plane.

First lens group 30 provides aberration correction at the intermediate image region, and balances aberration introduced by second lens group 50. First lens group 30 is characterized by low optical power; in this embodiment the group is slightly negative and operates to displace the light beam away from the optical axis, thus insuring clear separation of the light beam reflected off fold mirror 68. Without this beam displacement one or more optical elements would have to be truncated in order to avoid beam vignetting. Beam displacement can also be achieved by decentering or tilting an optical element, but this approach leads to a dramatic and generally unacceptable increase in distortion.

The remaining reduction is performed by the second reduction stage, primarily by second lens group 50. Lens group 50 is characterized by high positive power, which increases the NA of the system while providing telecentricity at the image plane. In the preferred embodiment the system is designed for a NA of 0.45, however the multiple mirror design of this invention is capable of NA's of between 0.5 and 0.6. Lens group 30, in conjunction with lens group 50, is used to remove inherent system aberrations.

Mirrors 40a and 40c are positive mirrors (concave) while mirror 40b is a negative mirror (convex). Mirror 40b operates to reduce the Petzval sum and thus flatten the field. In the preferred embodiment constraints are placed on mirrors 40a and 40c, constraining these mirrors to have the same curvature and the same center of curvature. Thus in FIG. 1 mirrors 40a and 40c are simply different segments of the same mirror. Using different portions of the same mirror structure at different points in the optical train decreases fabrication costs and eases alignment and mounting requirements.

Table 1 provides the optical prescription (construction parameters) for the system. In the table, the elements are numbered serially. Element no. 1 corresponds to fold mirror 65; element nos. 2–4 to mirrors 20a–c in mirror group 20; element nos. 5–11 to lenses 30a–g in lens group 30; element no. 12 to fold mirror 68; element nos. 13–15 to mirrors 40a–c in mirror group 40; and element nos. 16–24 to lenses in lens group 50. Fold mirrors 65 and 68 are oriented 45 degrees from the optical axis.

The specific embodiment uses two materials (fused silica and calcium fluoride) for the lens elements. This allows aberrations to be corrected over a range of wavelengths (192.9–193.7 nm) about a nominal wavelength of 193.3 nm. This provides improved performance in the projection system since the laser output is likely to be spread over a comparable range of wavelengths. While it is straightforward to design a somewhat less expensive system optimized for a single wavelength using only fused silica lens elements, the costs imposed by the constraints on the laser may outweigh the cost savings obtained by eliminating calcium fluoride lens elements from the design.

Figure 2A:
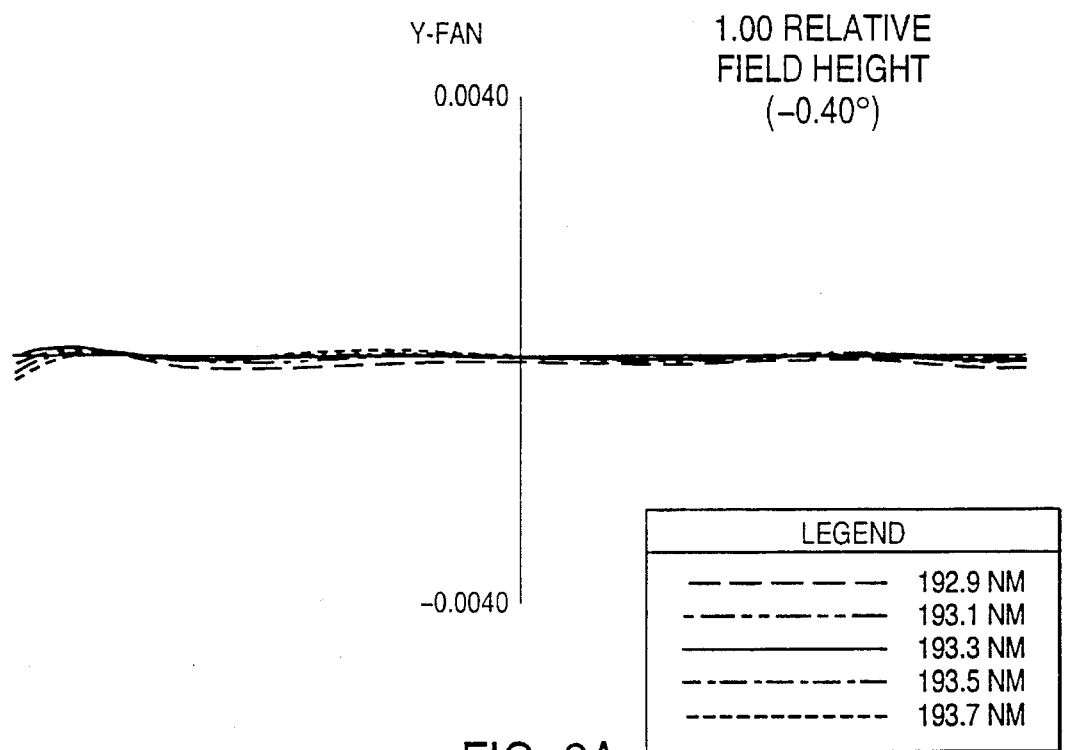
FIGS. 2A and 2B show ray aberration curves at the image plane for the top of a 1.5 mm wide ring field.
Figure 2B:
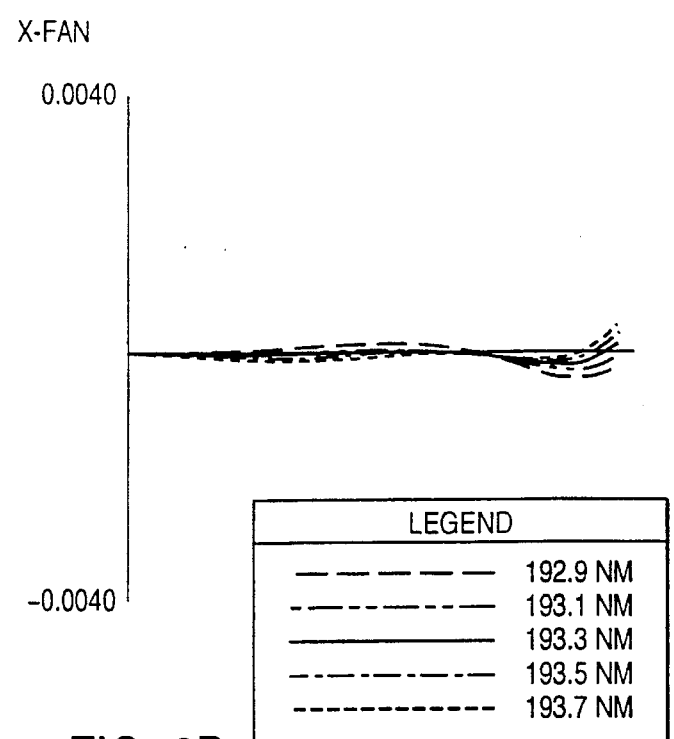
Figure 3A:
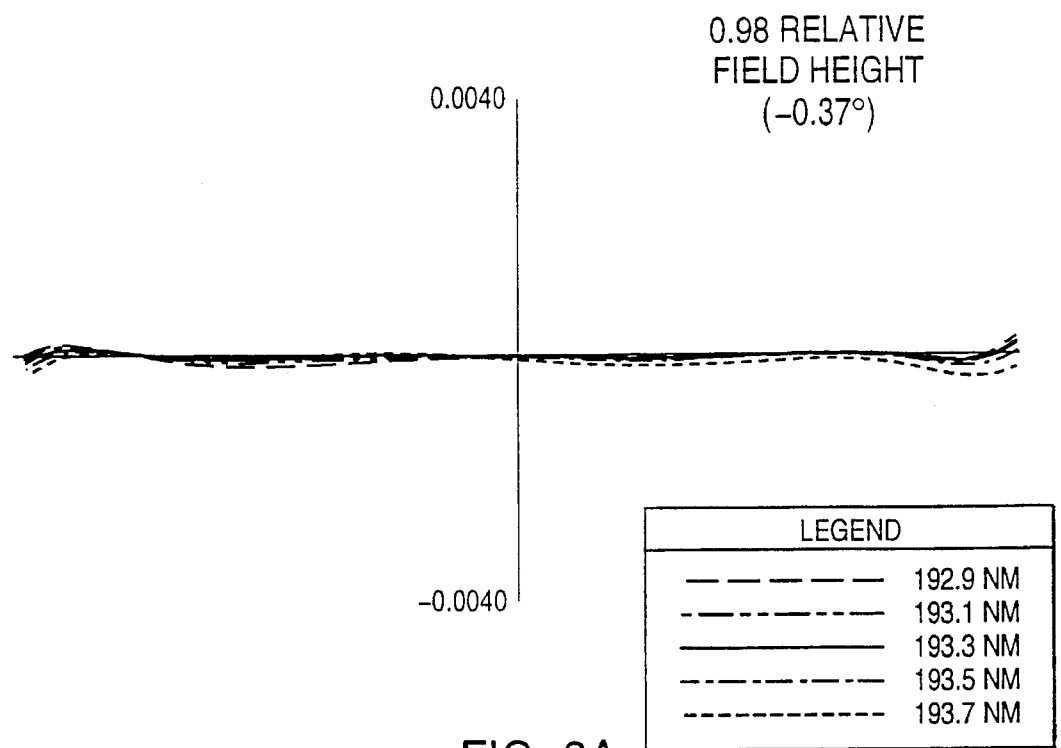
FIGS. 3A and 3B show ray aberration curves at the image plane for the middle of a 1.5 mm wide ring field.
Figure 3B:
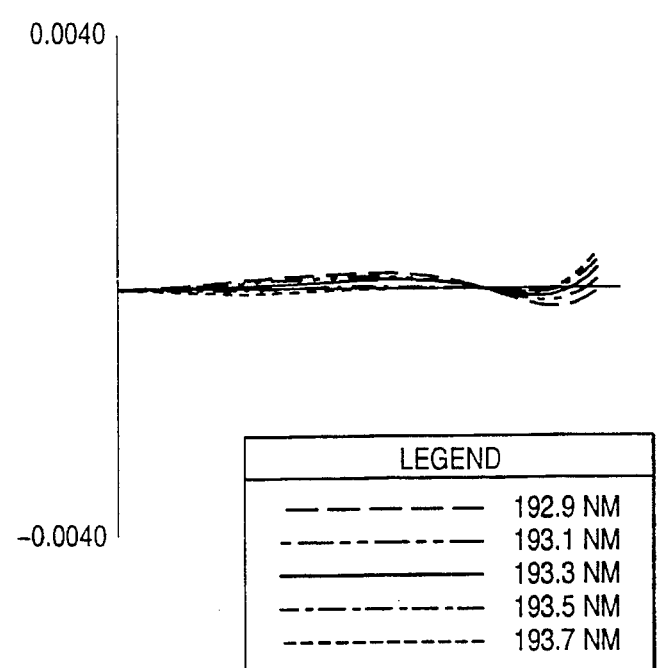
Figure 4A:
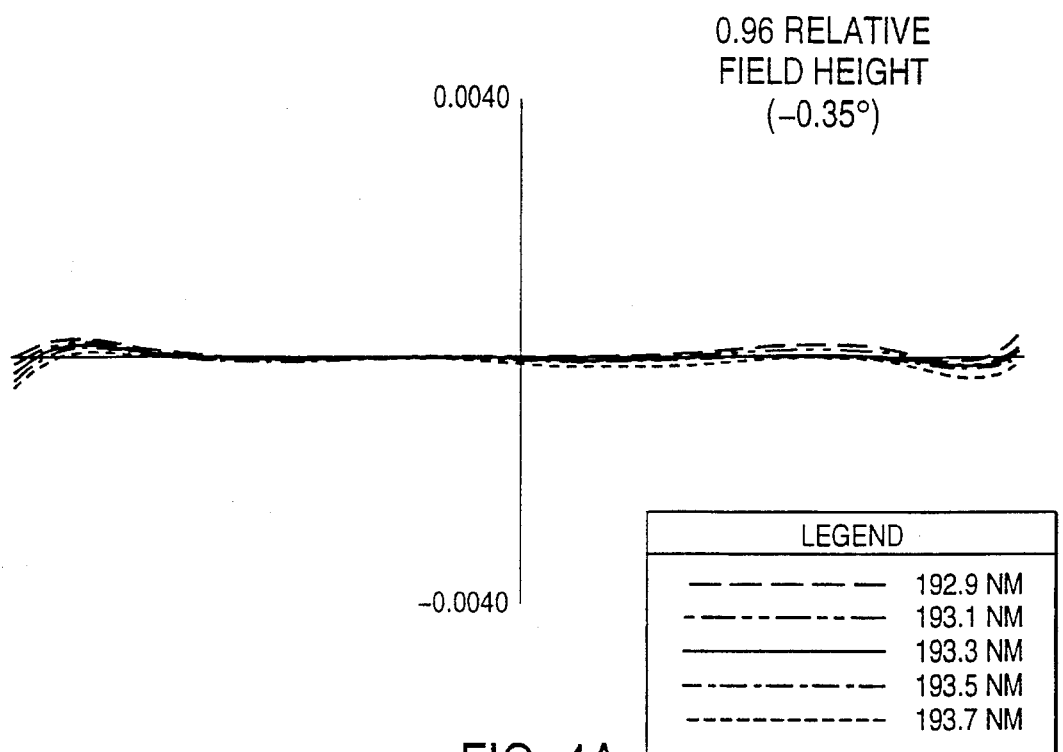
FIGS. 4A and 4B show ray aberration curves at the image plane for the bottom of a 1.5 mm wide ring field.
Figure 4B:
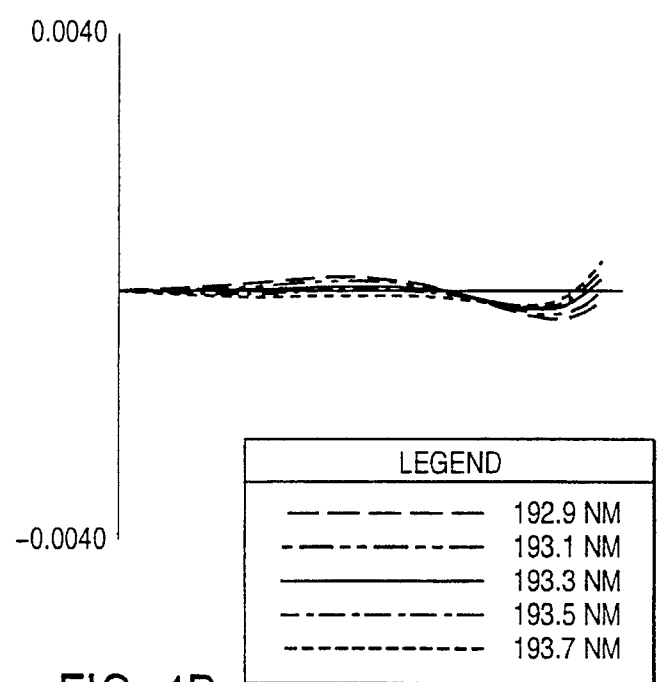

FIGS. 2A–B, 3A–B, and 4A–B show plots of ray aberrations at the image plane for the top (FIGS. 2A–B), middle (FIGS. 3A–B), and bottom (FIGS. 4A–B) of a 1.5 mm wide ring field. The monochromatic aberrations are shown as solid lines while the chromatic aberrations are shown as broken lines. FIGS. 2A, 3A, and 4A show aberrations in the tangential image plane, whereas FIGS. 2B, 3B, and 4B show the aberrations in the sagittal image plane. As can be seen, chromatic as well as monochromatic aberrations are well corrected.

In conclusion it can be seen that the present invention provides a design philosophy and implementation that allows high performance to be achieved without sacrificing ease of construction. The use of two multi-optical element image reduction subsystems provides a significant degree of design freedom that allows high NA and large field to be achieved.

While the above is a complete description of a specific embodiment of the invention, various alternative constructions, modifications, and equivalents may be used. For example, while the particular system is characterized by a reduction ratio of 4×(magnification=0.25), which is relevant to some microlithography applications, other reduction ratios can be accommodated by the design philosophy of the present invention.

Similarly, while the present invention makes it possible to achieve very high NA's (0.45 in the specific embodiment), there may be applications where such a high value is not required. In such a case, relaxation of the requirement for a high NA could be exploited to achieve a simpler optical design, requiring fewer optical elements and lowering the fabrication and manufacturing costs.

Furthermore, while the specific embodiment was optimized for operation about a nominal wavelength of 193.3 nm, other wavelengths can be accommodated. The indices of refraction of the materials would, of course, be somewhat different at the different wavelength, but the geometric parameters could be easily varied to account for this.

Therefore, the above description should not be taken as limiting the scope of the invention which is defined by the claims.

TABLE 1

| | OPTICAL PRESCRIPTION | | | | | |
|---|---|---|---|---|---|---|
| ELEMENT | RADIUS OF CURVATURE | | | APERTURE DIAMETER | | |
| NUMBER | FRONT | BACK | THICKNESS | FRONT | BACK | MATERIAL |
| OBJECT | INF | | 0.0000 | | | |
| | | | | 340.0000 | | |
| | | | 300.0000 | | | |
| 1 | INF | | −104.3380 | 520.1207 | | REFL |
| 2 | 827.8153 CC | | 292.0861 | 429.9484 | | REFL |
| | | | | 203.0316 | | |
| | | | 119.8062 | | | |
| | | | APERTURE STOP | 99.4076 | | |
| 3 | INF | | −119.8062 | 99.4076 | | REFL |
| 4 | 680.4242 CC | | 119.8062 | 198.6631 | | REFL |
| | | | | 226.6122 | | |
| | | | 20.0000 | | | |
| 5 | −170.4605 CC | 3044.1822 CC | 5.3435 | 221.4328 | 256.7056 | SiO2 |
| | | | 11.4984 | | | |
| 6 | 991.4454 CX | −231.4293 CX | 59.2259 | 281.9606 | 282.6211 | CaF2 |
| | | | 0.1000 | | | |
| 7 | 783.6475 CX | 246.7200 CC | 5.3295 | 299.7657 | 301.0872 | SiO2 |
| | | | 1.3557 | | | |
| 8 | 251.8948 CX | −348.5244 CX | 85.2468 | 301.2384 | 301.3572 | CaF2 |
| | | | 0.1000 | | | |
| 9 | −2582.5206 CC | 265.3270 CC | 4.0000 | 291.8083 | 283.9540 | SiO2 |
| | | | 2.1122 | | | |
| 10 | 277.4888 CX | −1073.6606 CX | 49.4951 | 283.9553 | 283.8639 | CaF2 |
| | | | 57.2737 | | | |
| 11 | −216.1221 CC | −1290.9891 CX | 6.2340 | 279.6244 | 300.0000 | SiO2 |
| | | | 35.3751 | | | |
| | | | | 323.1062 | | |
| | | | 400.0000 | | | |
| 12 | INF | | −220.8049 | 682.4479 | | REFL |
| 13 | 727.7739 CC | | 408.6208 | 822.1902 | | REFL |
| 14 | 292.5612 CX | | −408.6208 | 261.8245 | | REFL |
| 15 | 727.7739 CC | | 408.6208 | 424.3640 | | REFL |
| | | | | 151.7335 | | |
| | | | 20.0000 | | | |
| 16 | 145.1320 CX | 175.3991 CC | 6.0642 | 163.2645 | 162.9443 | SiO2 |
| | | | 0.9300 | | | |
| 17 | 158.0925 CX | 409.8183 CC | 17.5153 | 163.2098 | 162.2101 | CaF2 |
| | | | 13.1039 | | | |
| 18 | −666.7868 CC | 178.3052 CC | 11.0615 | 162.1952 | 158.4982 | SiO2 |
| | | | 12.3505 | | | |
| 19 | 154.5525 CX | −1197.2407 CX | 38.0000 | 166.1494 | 164.3937 | CaF2 |
| | | | 1.5809 | | | |
| 20 | 141.9734 CX | 86.3422 CC | 12.0468 | 155.9346 | 140.1808 | SiO2 |
| | | | 9.5005 | | | |
| 21 | 89.7995 CX | 525.8126 CC | 38.0000 | 145.5644 | 142.3397 | CaF2 |
| | | | 13.4512 | | | |
| 22 | 144.1641 CX | 69.1800 CC | 4.0701 | 125.5047 | 111.1213 | SiO2 |
| | | | 0.1000 | | | |
| 23 | 69.2125 CX | −409.4238 CX | 38.0000 | 111.1231 | 106.1130 | CaF2 |
| | | | 2.4123 | | | |
| 24 | −243.0146 CC | INF | 11.9500 | 106.1091 | 95.2351 | SiO2 |
| | IMAGE DISTANCE = | | 10.0000 | | | |
| IMAGE | INF | | | 85.0013 | | |

NOTES
Positive radius indicates the center of curvature is to the right
Negative radius indicates the center of curvature is to the left
Dimensions are given in millimeters
Thickness is axial distance to next surface
Image diameter shown above is a paraxial value, it is not a ray traced value

| INFINITE CONJUGATES | | |
| --- | --- | --- |
| EFL | = | −21249.8271 |
| BFL | = | −5302.3867 |
| FFL | = | 84999.3180 |
| F/NO | = | −1.1090 |
| AT USED CONJUGATES | | |
| REDUCTION. | = | −0.2500 |
| FINITE F/NO | = | −1.1161 |
| OBJECT DIST | = | 0.0000 |
| TOTAL TRACK | = | 1798.1972 |
| IMAGE DIST | = | 10.0000 |
| OAL | = | 1788.1972 |
| PARAXIAL | | |
| IMAGE HT | = | 42.5000 |
| IMAGE DIST | = | 10.0695 |
| SEMI-FIELD | | |
| ANGLE | = | 0.3966 |
| ENTR PUPIL | | |
| DIAMETER | = | 19160.4914 |
| DISTANCE | = | 84999.7212 |
| EXIT PUPIL | | |
| DIAMETER | = | 0.101E+10 |
| DISTANCE | = | 0.112e+10 |

NOTES
FFL is measured from the first surface
BFL is measured from the last surface

What is claimed is:

1. A catadioptric reduction projection optical system for producing a reduced image of an object, comprising, in a light path sequence from the object:
   a first reduction stage, including a first mirror group having at least one concave mirror, forming an intermediate image of reduced size at an intermediate image region; and
   a second reduction stage, including a second mirror group and a lens group, forming a final image of further reduced size at a final image plane, said second mirror group including a plurality of mirrors.

2. The optical system of claim 1 wherein said first reduction stage includes a lens group consisting entirely of full diameter elements.

3. The optical system of claim 1 wherein said first mirror group comprises first and second concave mirrors that provide a net optical reduction.

4. The optical system of claim 3 wherein said first mirror group further includes a folding mirror located between said first and second concave mirrors.

5. The optical system of claim 4 wherein said folding mirror is planar.

6. The optical system of claim 4, and further comprising an aperture stop proximate said folding mirror.

7. The optical system of claim 6 wherein said aperture stop is defined by said folding mirror.

8. The optical system of claim 1 wherein all elements in said lens group in said second reduction stage are full diameter elements.

9. The optical system of claim 1, wherein all the lens elements are centered on a common optical axis.

10. The optical system of claim 1 wherein said second mirror group comprises first and second concave mirrors and a convex mirror between said first and second concave mirrors.

11. The optical system of claim 1 wherein said second mirror group comprises a concave mirror and a convex mirror.

12. The optical system of claim 1, and further comprising a folding mirror located between the object and said first mirror group.

13. The optical system of claim 1, and further comprising a folding mirror located between said first reduction stage and said second mirror group.

14. The optical system of claim 1, wherein the optical system has a numerical aperture greater than or equal to 0.45.

15. The optical system of claim 1 wherein said lens group in said second reduction stage is positive.

16. A catadioptric reduction projection optical system for producing a reduced image of an object, comprising, in a light path sequence from the object:
   a first mirror group;
   a first lens group consisting entirely of full diameter elements;
   said first mirror group and said first lens group forming an intermediate image of reduced size at an intermediate image region;
   a second mirror group including a plurality of mirrors; and
   a second lens group, said second mirror group including a plurality of mirrors;
   said second mirror group and said second lens group forming a final image of further reduced size at a final image plane.

17. The optical system of claim 16 wherein said first lens group is negative.

18. The optical system of claim 16 wherein said second lens group is positive.

19. The optical system of claim 16 wherein said first mirror group comprises first and second concave mirrors that provide a net optical reduction.

20. The optical system of claim 19, and further comprising a folding mirror located between said first and second concave mirrors.

21. The optical system of claim 20 wherein said folding mirror is planar.

22. The optical system of claim 20, and further comprising an aperture stop proximate said folding mirror.

23. The optical system of claim 22 wherein said aperture stop is defined by a folding mirror located between said first and second concave mirrors.

24. The optical system of claim 16 wherein all elements in said first lens group, and said second lens group are full diameter elements.

25. The optical system of claim 16, wherein all the lens elements are centered on a common optical axis and all curved mirror elements have their centers of curvature centered on the common optical axis.

26. The optical system of claim 16 wherein said second mirror group comprises first and second concave mirrors and a convex mirror between said first and second concave mirrors.

27. The optical system of claim 16 wherein said second mirror group comprises a concave mirror and a convex mirror.

28. The optical system of claim 16, and further comprising a folding mirror located between said first lens group and said second mirror group.

29. The optical system of claim 16, wherein the optical system has a numerical aperture greater than or equal to 0.45.

30. A catadioptric reduction projection optical system for producing a reduced image of an object, comprising, in a light path sequence from the object:
   a first mirror group including first and second concave mirrors and a folding mirror located between said first and second concave mirrors;
   a first lens group consisting entirely of full diameter elements;

said first mirror group and said first lens group forming an intermediate image of reduced size at an intermediate image region;

a second mirror group including first and second concave mirrors and a convex mirror between said first and second concave mirrors; and a second lens group consisting entirely of full diameter elements;

said second mirror group and said second lens group forming a final image of further reduced size at a final image plane.

31. The optical system of claim 30 wherein said folding mirror is planar.

32. The optical system of claim 30 wherein:
said first lens group is negative; and
said second lens group is positive.

33. The optical system of claim 30, and further comprising an aperture stop proximate said folding mirror.

34. The optical system of claim 33 wherein said aperture stop is defined by said folding mirror.

35. The optical system of claim 30, wherein:
all the lens elements are centered on a common optical axis; and
all curved mirror elements have their centers of curvature centered on the common optical axis.

36. The optical system of claim 30, and further comprising a folding mirror located between said first lens group and said second mirror group.

37. The optical system of claim 30, wherein the optical system has a numerical aperture greater than or equal to 0.45.

* * * * *